(12) United States Patent
Riley et al.

(10) Patent No.: US 7,630,228 B2
(45) Date of Patent: Dec. 8, 2009

(54) METHODS AND APPARATUSES FOR OPERATING MEMORY

(75) Inventors: John Reginald Riley, Austin, TX (US); Mohammed Hasan Taufique, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 11/897,442

(22) Filed: Aug. 30, 2007

(65) Prior Publication Data

US 2009/0059690 A1 Mar. 5, 2009

(51) Int. Cl.
*G11C 11/00* (2006.01)

(52) U.S. Cl. ...................... 365/154; 365/226
(58) Field of Classification Search .................. 365/154, 365/226
See application file for complete search history.

(56) References Cited

U.S. PATENT DOCUMENTS

| | | | | |
|---|---|---|---|---|
| 4,207,615 A | | 6/1980 | Mars | |
| 5,486,780 A | * | 1/1996 | Lu | 327/53 |
| 5,592,411 A | * | 1/1997 | Tai | 365/145 |
| 5,808,942 A | * | 9/1998 | Sharpe-Geisler | 365/189.08 |
| 5,825,715 A | * | 10/1998 | Rezeanu | 365/233.5 |
| 6,191,989 B1 | * | 2/2001 | Luk et al. | 365/207 |
| 6,330,203 B1 | * | 12/2001 | Earl | 365/222 |
| 6,501,698 B1 | * | 12/2002 | Mobley | 365/221 |
| 6,525,896 B2 | * | 2/2003 | Chung et al. | 360/68 |
| 6,643,213 B2 | * | 11/2003 | Perner et al. | 365/230.06 |
| 6,795,350 B2 | * | 9/2004 | Chen et al. | 365/189.07 |
| 7,200,039 B2 | * | 4/2007 | Lee | 365/185.18 |
| 2004/0233716 A1 | * | 11/2004 | Tran et al. | 365/185.09 |
| 2007/0008776 A1 | * | 1/2007 | Scheuerlein | 365/185.17 |
| 2008/0244182 A1 | * | 10/2008 | Abella et al. | 711/128 |
| 2008/0265962 A1 | * | 10/2008 | Waldrip et al. | 327/202 |

* cited by examiner

*Primary Examiner*—Michael T Tran
(74) *Attorney, Agent, or Firm*—Schubert Osterrieder & Nickelson PLLC; Erik J. Osterrieder

(57) ABSTRACT

In one embodiment a low voltage high performance memory system is disclosed. The system can include a bit cell, a first pass gate coupled to the bit cell to receive a write signal, a second pass gate coupled to the bit cell to receive the write signal, and an supply current controller to reduce current to at least a portion of the bit cell and to supply current to another portion of the cell in response to a write control signal and a data signal during a bit cell transition. Reducing the current to a portion of the bit cell and supplying current to another portion of the bit cell during transition can allow the bit cell to transition to a different state faster and can reduce the effects of device variations that manifest during low voltage operation. Other embodiments are also disclosed.

19 Claims, 3 Drawing Sheets

METHODS AND APPARATUSES FOR OPERATING MEMORY

FIELD

Methods and apparatuses disclosed herein relate to the field of computers and more particularly, to the field of computer memory.

BACKGROUND

Manufactures of electrical devices such as computers continue to strive to make these devices more efficient. One way to make these devices more efficient is to lower the operating voltage of the device. Hence many of these devices utilize low voltage processors. Many low voltage processors can operate with a supply voltage of less than one volt. Such low voltage operation allows a device such as a computer to save significant power and run on battery power for extended periods of time. Further, with the advent of multi-core processors, power conservation has become more important for devices such as laptop computers. New manufacturing technologies such as technologies that can manufacture integrated circuit components that are smaller than 65-nm have created many additional technological challenges for designers of low voltage systems. One such challenge is related to higher intrinsic device variations (i.e. device leakage (Le) and threshold voltages (Vt)) associated with sub 65-nm manufacturing technology. Sensitivity of circuit parameters such as device switching at such low voltages due to manufacturing defects in another challenge for designers.

Generally, the minimum operating voltage (Vcc min) of a processor is limited by a minimum voltage that is required by memory systems in order to read from and write to memory cells. It can be appreciated that the amount of high performance data storage (i.e. memory cells) being incorporated with processors is ever increasing. Low voltage sub 65-nm processors that have low voltage, high performance memory typically have a significant yield loss during the testing and burn in procedure. These lower yields have made manufacturers of processors reconsider if lower voltages are economically feasible and what voltage levels are economically practical. Hence, there has been a trend to design and operate current processors at higher voltages than previous processors in an effort to provide an improved cost/performance trade off because of high performance memory problems. It can be appreciated that manufacturers are investing alternate circuit topologies to the conventional memory structures that can operate at lower voltages and can be manufactured with higher yields.

DETAILED DESCRIPTION OF EMBODIMENTS

The following is a detailed description of embodiments in the accompanying drawings. The embodiments are in such detail as to clearly communicate an invention. However, the amount of detail offered is not intended to limit the anticipated variations of embodiments; but on the contrary, the intention is to cover all modifications, equivalents, and alternatives falling within the spirit and scope of the appended claims. While specific embodiments will be described below with reference to particular circuit or logic configurations, those of skill in the art will realize that some embodiments of the invention may advantageously be implemented with other similar configurations.

In some embodiments provided herein, a low voltage memory system that can provide improved manufacturing yields and can provide improved performance when compared to traditional memory configurations is described. In some embodiments, the memory system can be utilized by a processor as a single write-port register file (RF), as cache memory or as high performance memory. A supply current controller circuit (SCCC) can be coupled to nodes of a bit cell to assist the bit cell in toggling to a different state by supplying current to a low side of the cell and reducing the current supplied to the high side of the cell during transition of the cell to a different state. The SCCC circuit can be driven by the data lines and a write control line.

Figure 1:
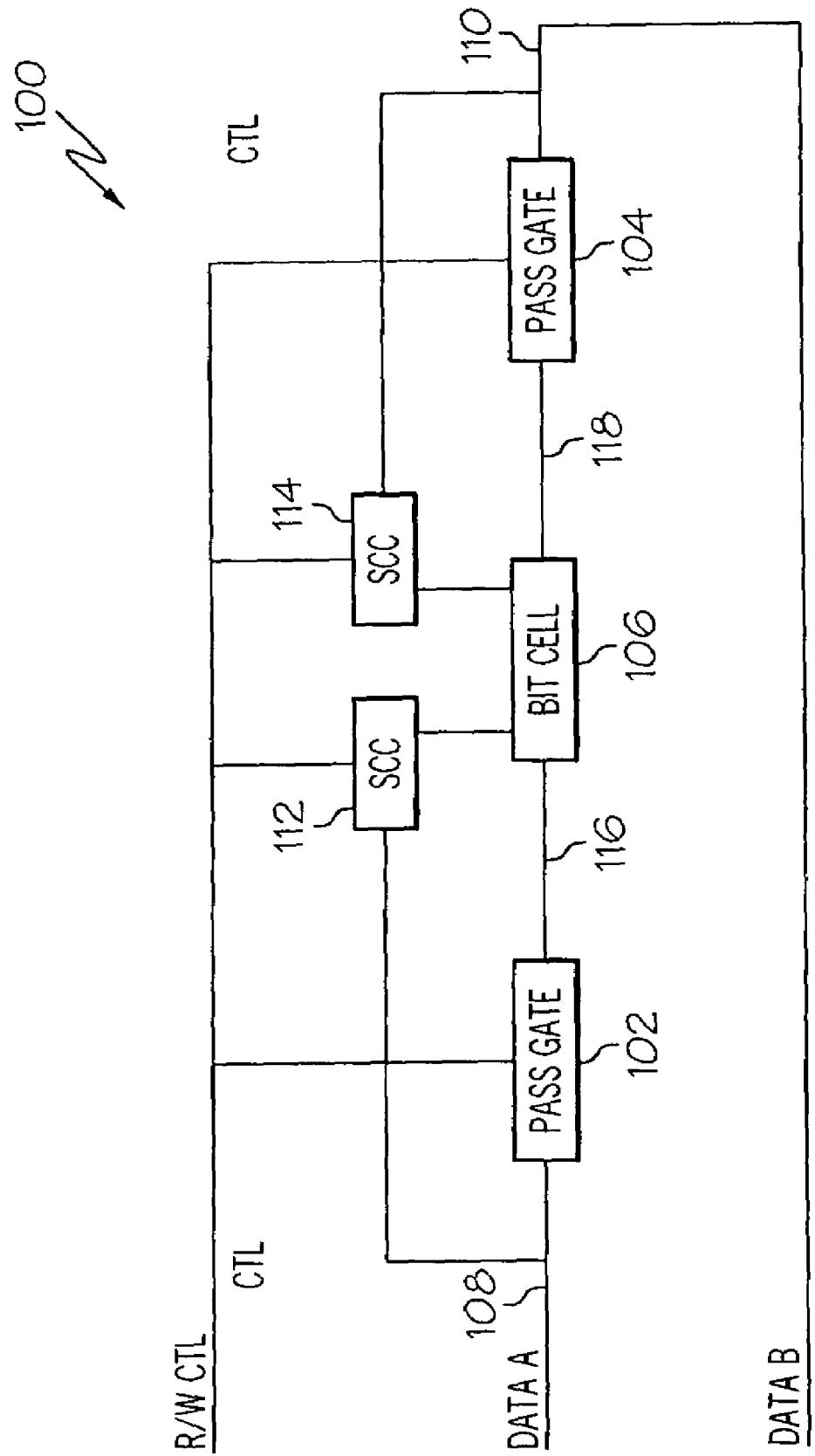
FIG. 1 depicts a memory system.

Referring to FIG. 1 a memory system 100 is illustrated. The memory system 100 can include pass gate 102, bit cell 106, pass gate 104, supply current controller circuit (SCCC) 112, and supply current controller circuit (SCCC) 114. The bit cell 106 may include two cross-coupled invertors formed by four transistors (not shown). A differential signal (DATA A and DATA B) can be utilized to drive the bit cell 106 and set or reset the value stored by the bit cell 106. During a write operation, DATA A line 108 can be driven high or low by registers or line drivers within a processor (not shown) and DATA_B can be driven to an opposing state. Such a differential signal can be applied until the bit cell 106 "flips" to the appropriate state such that the bit cell 106 stores the appropriate value as provided by DATA A and DATA B.

Using a differential signal to set or reset the bit cell 106 can provide added reliability, however, using a differential signal to drive the bit cell 106 generally consumes more power than a single ended signal as either type of signaling can be utilized with the system 100. During the write operation, pass gate 102 can be turned on such that the DATA A signal is connected to the memory cell 106 and pass gate 104 can be turned on such that DATA B is connected to the bit cell 106. Pass gates 102 and 104 are not ideal devices and typically have an inherent voltage drop when turned on that can be significant when the system is operated at low supply voltages. When pass gates 102 and 104 have a relatively large voltage drop when turned on the voltage on the input of the bit cell 106 will not toggle to the appropriate value possibly creating system failures.

When device variations (Le and Vt) are considered in conjunction with lower Vcc operation, the bit cell 106 may become susceptible to write failures because it does not toggle responsive to the DATA A and DATA B lines. Write failures are typically related to the direct current voltage (DC) level applied to the bit cell and this type of write failure typically contributes most to yield losses and the unacceptable level of defects for lower voltage computing devices as described above. In addition, as a result of device variations, many conventional memory cell structures have conflicting sizing requirement between P-type field effect transistors (PFETs) of the invertors in the bit cell 160 and N-type FET pass gates. For example, in order to achieve a lower retention voltage, PFETs are often upsized which, in turn, degrades low voltage write performance and can cause write failures.

SCCCs 112 and 114 can be configured between a power rail or supply rail and the bit cell 106 and can reduce the supply current to the bit cell 106 or isolate the bit cell 106 from the supply voltage when turned off and can provide a current to the bit cell 106 when turned on. Small leakage currents may still supply the bit cell nodes even when transistors of an SCCC 112, 114 are turned off. Further, a pair of transistors can be coupled across the DATA A line and the write control line and another pair of transistors can be configured across the DATA B line and the write control line. SCCCs 112 and 114 can be controlled by signals from the DATA A line 108 the DATA B line 110 and the write control line. When the SCCCs 112 and 114 are turned on, the current or power to the transistors that are holding the logic high can be interrupted allowing the pass-gate transistor to drain the remaining charge without "fighting" the additional current from the supply rail. Likewise, the logic low side of the bit-cell that is transitioning high can receive a current to speed the transition to a logic high.

Some embodiments of the illustrated system decouple the conflicting requirements between retention of a signal in the bit cell 106 and writability to the bit cell 106 by interrupting PFETs in the cross coupled inverters in bit cell 106 during a write operation or during a write cycle. Some embodiments can utilize a signal on the DATA_A or DATA_B to "complete" a full write of a logic high or a logic "1" when the current to the storage node is interrupted. The SCCCs 112 and 114 allow the bit cell 106 to operate at a much lower voltage than traditional cells even when significant device variations exist throughout the system 100.

Figure 2:
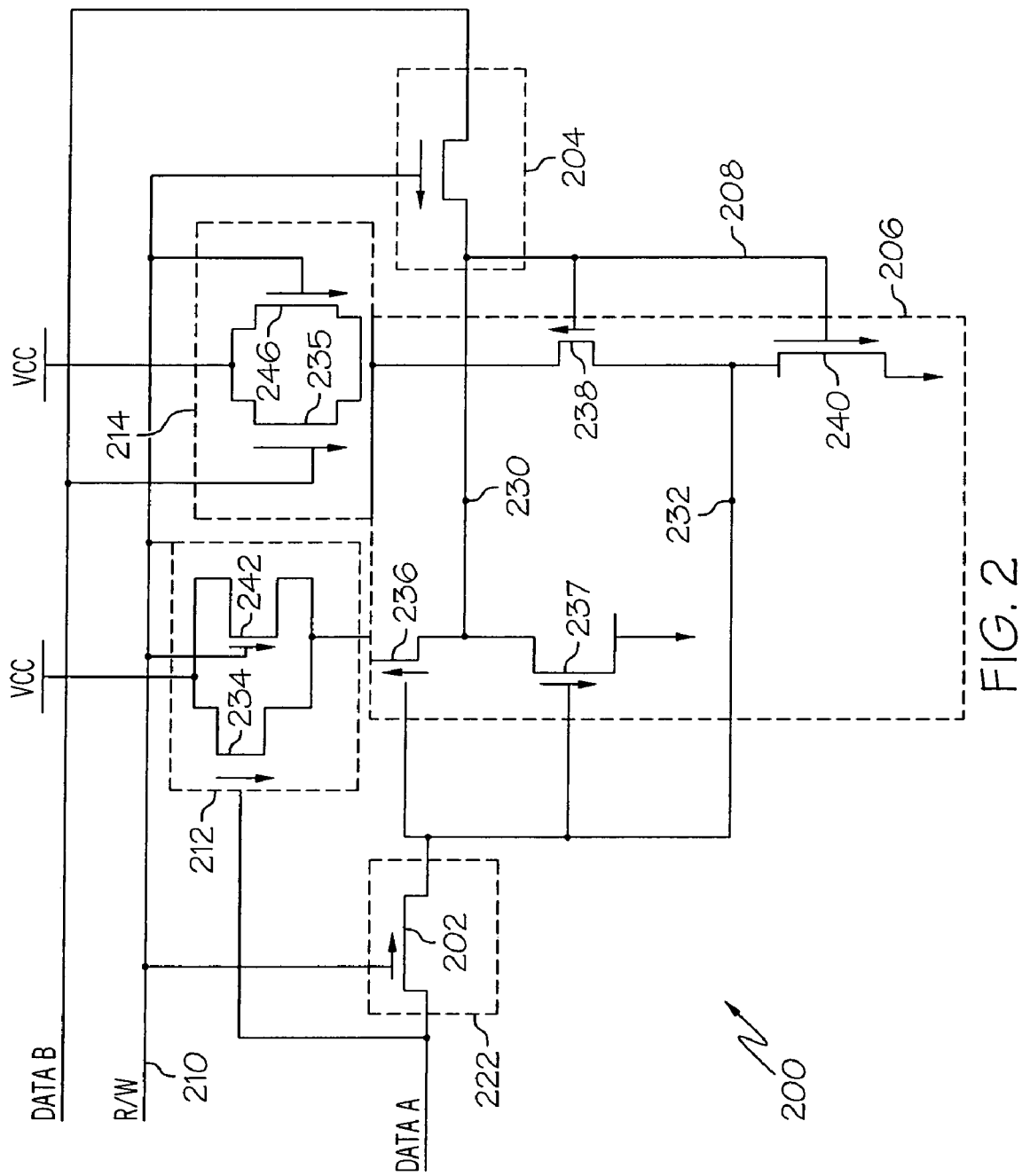
FIG. 2 illustrates a more detailed view of a memory system.

Referring to FIG. 2, a data controlled interruptible memory system 200 is illustrated. The system 200 can include a DATA A pass gate 202, a DATA B pass gate 204, a bit cell 206, and SCCCs 212 and 214. Bit cell 206 can be formed by four transistors 237, 236, 238 and 240. Transistors 236 and 238 can be PFETs and transistors 237 and 240 can be NFETS. Transistors 236, 237, 238, and 240 can be configured as cross coupled inverters.

During a write operation, write enable line 210 can be driven high and the current to transistors 236 and 238 can be interrupted as transistor 242 and 246 can be turned off by the write control line 210. Turning off transistors 242 and 246 can remove the contention or opposing voltages seen between the NFET pass gates 202 and 204 when the data driver is pulling the DATA A line and/or the DATA B line (whichever it may be) high or low. Thus, when the state of the cell 206 is to be changed during a write process, SCCCs 212 and 214 can interrupt current to the storage node of the cell that is high, to assist in reducing the voltage at this node and can boost the node that is rising to a logic 1 by supplying a supplemental current to this node. Accordingly, during a write cycle that transitions the bit cell, the logic low side of the cell can get a current and the logic high side can have its current interrupted or receive a reduced current such that the bit cell 206 can transition faster and can transition reliably even when powered by lower supply voltages. Lower supply voltages can include supply voltages under one volt.

Thus, SCCCs 212 and 214 can be connected between supply power, Vcc, and a conventional bit cell and can push and/or pull the appropriate nodes of the bit cell 206 high or low by switching currents. SCCCs 212 and 214 can provide a faster discharge of nodes 230 or 232 when the nodes 230 or 232 are driven high to low. While current to the bit cell 206 is "interrupted," depending on the state of the bit cell, a higher voltage can be delivered to the it cell nodes 230 or 232 either through transistors 236 and 234 or through transistors 235 and 238. The stacking nature of the PFETs (242, 236 and 234 or 246, 238 and 235) can contribute to mitigating the systems sensitivity to manufacturing variations (Vth, Le etc.) found in devices. The devices 242, 236, 234, 246, 238 and 235 can be manufactured utilizing sub-65 micron lithography and a system 200. Memory cells with such small devices can be very sensitive to device variations however, the disclosed configuration using even sub-45 micron devices can improve performance and reduce failures due to such device variations.

The disclosed design can provide a memory cell 200 that has more than one hundred times the immunity to manufacturing variations (Vth, Le etc.) that commonly cause write failures of the cell 206 when compared to traditional cell designs. Further, some embodiments described herein are less sensitive to process skews. It can be appreciated the proposed structure has been simulated as operational with a supply voltage of 650 mV of supply voltage and it has been determined that a 4.5-sigma yield can be achieved, while conventional designs will not reliably operate at such voltages. In addition to a standard write operation, memory cell can also operate for a differential write where bit lines are pre-charged high and only one of the two bit lines are pulled low to reduce power consumption. It can be appreciated that some of the disclosed embodiments do not require additional control logic signals or conductors to be compatible with memory control protocols such as those utilized by registers or register files, or cache infrastructures. The cells can also be implemented using P-type metallic oxide semiconductors (P-MOS) transfer gates and an N-type MOS interrupted stack.

It is anticipated by many that Le and Vt variations will become increasingly more difficult to overcome as devices get smaller and smaller. This is particularly true for conventional designs that utilize a "Jam" structure with a minimized supply voltage or a supply voltage limiter and the fabricated devices are sub-45 nm technology. By decoupling retention and writability of the memory cell by using an SCCC, some of the disclosed embodiments provide excellent performance and higher yield for devices that are operated at lower supply voltages.

Figure 3:
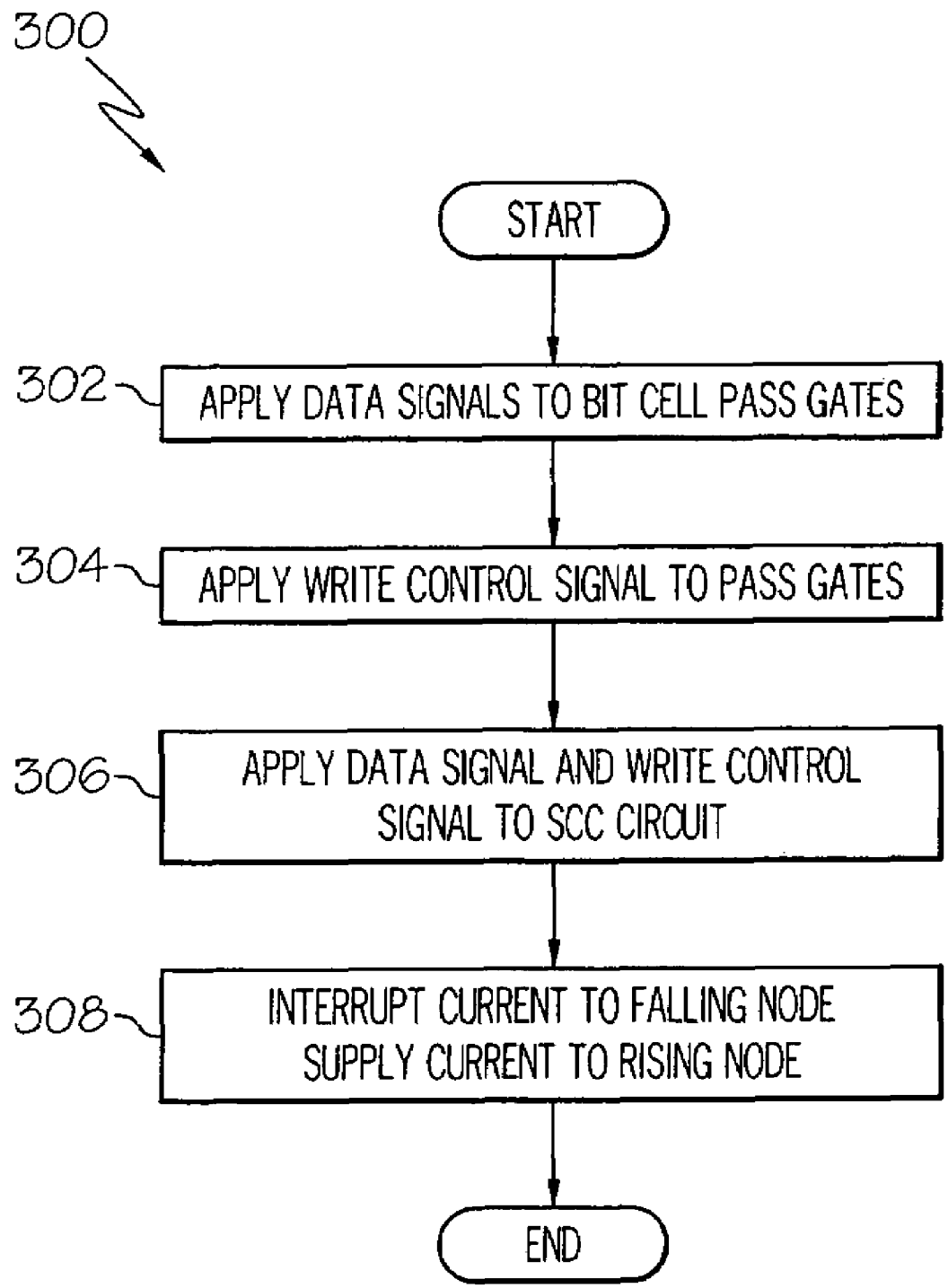
FIG. 3 is a flow diagram of how a memory system may operate.

Referring to FIG. 3 a flow diagram 300 for operating a memory cell is disclosed. As illustrated by block 302, a data signal or data signals can be provided to a bit cell pass gate. As illustrated by block 304, a write control signal can be applied to the pass gate(s). The data signal and the write control signal can be applied to a supply current control circuit as illustrated by block 306. The supply current control circuit can substantially reduce or interrupt current to the bit cell (which may be falling to a lower voltage level) and provide current to the low side of the bit cell (which will be increasing to a higher voltage level) as illustrated by block 308. Thereafter, the process can end.

Although the embodiments and some of their advantages have been described in detail, it should be understood that various changes, substitutions and alterations may be made herein without departing from the spirit and scope of the invention as defined by the appended claims. Although an embodiment of the invention may achieve multiple objectives, not every embodiment falling within the scope of the attached claims will achieve every objective. Moreover, the scope of this document is not intended to be limited to the particular embodiments of the process, machine, manufacture, composition of matter and methods described in the specification.

As one of ordinary skill in the art will readily appreciate from the teachings herein processes, machines, manufacture, compositions of matter and methods presently existing or later to be developed that perform substantially the same function or achieve substantially the same result as the corresponding embodiments described herein may be utilized according to some embodiments of the invention. Accordingly, the appended claims are intended to include within their scope such processes, machines, manufacture, compositions of matter, and methods.

What is claimed is:

1. An apparatus comprising:
   a bit cell;
   a first pass gate coupled to the bit cell to receive a write signal;
   a second pass gate coupled to the bit cell to receive the write signal; and
   a supply current control circuit to substantially isolate at least a portion of the bit cell from a power rail via channels of the transistors in response to the write signal and a data signal, wherein the supply current control circuit comprises at least two transistors.

2. The apparatus of claim 1, further comprising a second current control circuit to substantially isolate at least a second portion of the bit cell from the power rail in response to the write signal and a second data signal.

3. The apparatus of claim 2, wherein the first data signal and the second data signal to provide a differential data signal.

4. The apparatus of claim 2, wherein the second supply current control circuit comprises two P-channel field effect transistors.

5. The apparatus of claim 4, wherein the two P-channel field effect transistors turn on responsive to a state of the bit cell.

6. The apparatus of claim 3, wherein the second supply current controller has a transistor coupled between a bit cell node and a data line and a transistor coupled between the bit cell node and a write control line.

7. The apparatus of claim 1, wherein the supply current control circuit comprises two P-channel field effect transistors.

8. The apparatus of claim 7, wherein the two P-channel field effect transistors turn on responsive to a state of the bit cell.

9. The apparatus of claim 1, wherein the supply current controller has a transistor coupled between a bit cell node and a data line and a transistor coupled between the bit cell node and a write control line.

10. The apparatus of claim 1, wherein the bit cell to operate when powered by less than one volt on the power rail.

11. The apparatus of claim 1, wherein the bit cell comprises P-channel transistors manufactured utilizing sub-65 nanometer lithography.

12. The apparatus of claim 1, wherein, the power rail to provide a supply voltage of less than 700 milli-volts.

13. A method comprising:
   applying a write control signal and a first data signal to a first pass gate;
   applying the write control signal and a second data signal to a second pass gate;
   applying the write control signal and the first data signal to a first supply current control circuit, wherein the first supply current control circuit comprises at least two transistors; and
   applying the write control signal and the second data signal to a second supply current control circuit, wherein the second supply current control circuit comprises at least two transistors.

14. The method of claim 13, further comprising interrupting current to the bit cell in response to the write control signal and the first data signal.

15. The method of claim 13, further comprising interrupting current to at least a portion of the bit cell in response to the first data signal and the write control signal.

16. The method of claim 13, further comprising sourcing current to at least a portion of the bit cell in response to the first data signal and the write control signal.

17. The method of claim 13, further comprising interrupting current to at least a portion of the bit cell in response to a second data signal and the write control signal.

18. The method of claim 13, further comprising supplying current to at least a portion of the bit cell in response to a second data signal and the write control signal.

19. The method of claim 13, further comprising operating the bit cell as a cache memory.

* * * * *